United States Patent [19]

Lee

[11] 4,256,229
[45] Mar. 17, 1981

[54] BOAT FOR WAFER PROCESSING

[75] Inventor: Steven N. Lee, Irvine, Calif.

[73] Assignee: Rockwell International Corporation, El Segundo, Calif.

[21] Appl. No.: 76,045

[22] Filed: Sep. 17, 1979

[51] Int. Cl.³ ............................................. B05C 13/02
[52] U.S. Cl. ........................................................ 211/41
[58] Field of Search ................... 211/41, 40; 118/500, 118/728, 715, 729; 432/1 NQ; 148/189; 206/328

[56] References Cited

U.S. PATENT DOCUMENTS

| | | | |
|---|---|---|---|
| 3,553,037 | 1/1971 | Bell | 148/189 |
| 3,826,377 | 7/1974 | Bachmann | 211/41 |
| 3,834,349 | 9/1974 | Dietze et al. | 211/41 |
| 3,923,156 | 12/1975 | Wallestad | 118/500 X |
| 4,176,751 | 12/1979 | Gillissie | 211/41 |

FOREIGN PATENT DOCUMENTS

| | | | |
|---|---|---|---|
| 950052 | 2/1964 | United Kingdom | 211/41 |
| 1436503 | 5/1976 | United Kingdom | 211/41 |

OTHER PUBLICATIONS

IBM Technical Disclosure Bulletin, vol. 19, No. 10, (Mar. 1977), pp. 3734–3735, Clark et al., "Wafer Holder".

*Primary Examiner*—Morris Kaplan
*Attorney, Agent, or Firm*—H. Fredrick Hamann; Daniel R. McGlynn; Wilfred G. Caldwell

[57] ABSTRACT

A boat for use in wafer processing technology such as associated with semiconductor wafers. The boat consists of a relatively flat bottom plate having a plurality of substantially parallel V-cut notches therein on which the bottom of the wafer rests and two parallel side rails disposed above and on either side of the flat bottom plate for holding the sides of the wafer. The two side rails includes a plurality of opposed U-shaped notches cut in parallel along the inner surface of the side rails for movably securing the opposite side edges of the wafer placed in the boat. Each pair of opposed U-shaped notches being offset with respect to a V-cut notch operatively associated therewith. Such boats are applicable to wafer handling areas including oxidation, diffusion, low pressure chemical vapor deposition (LPCVD), plasma etching, chemical etching, photoresist coating, baking, stripping, ultrasonic cleaning, and other automatic wafer handling operations. In addition to applicability to semiconductor processing technology, the boat is also applicable to other electronic processing technology such as the processing of magnetic bubble substrate materials.

7 Claims, 8 Drawing Figures

BOAT FOR WAFER PROCESSING

BACKGROUND OF THE INVENTION

There are a wide variety of commercially available boats for processing silicon wafers in semiconductor technology. Although such boats are typically for use with silicon wafers or wafers composed of a single semiconductor material, more recent developments in semiconductor technology have been making use of binary materials in which the wafer is composed of more than one element. An example of such a wafer is a silicon-on-sapphire wafer in which one side is composed of silicon whereas the other side is sapphire. When such wafers, as well as silicon wafers, are heated and cooled during a circuit fabrication process, the temperature of one surface increases faster than the other due to difference in thermal properties such as heat absorption, heat conduction, and radiation, or other factors such as in the spacing between adjacent wafers. Thus the thermal expansion of one material is different from the other resulting in a warping of the wafer into a shape much like a potato chip. When the commercially available boats designed for silicon technology are used with such wafers of binary materials, the wafer warpage often exceeds the wafer breaking point and the constraints and pressures imposed on the designs of the prior art processing boats jam the wafers in a given position so that the wafers have a greater tendency to break as they warp during the fabrication process.

The same breakage problem is also present (although to a smaller extent) in silicon wafers due to warpage during processing. In particular during the warping process the effective diameter of the wafer decreases and the wafer settles deeper into the various grooves provided in the prior art boats. As the wafers gradually reach thermal equilibrium the wafers begin to straighten out and as the wafer diameter again increases the wafers jam and break due to the changed position.

The wafer breakage due to the thermal shock and warping is observed in the bulk silicon processing for NMOS, PMOS, CMOS or bipolar circuits. In this case, the front surface of the silicon wafers is polished to a mirror-like surface while the back side is merely lapped. These two surfaces also have different thermal properties and the wafers warp during heating and cooling. Thus, a certain wafer breakage rate exists even in the bulk silicon processing although the breakage rate is lower than the SOS wafers. Magnetic garnet wafers and GaAs wafers have a similar breakage problem as SOS wafers.

Prior to the present invention there has not been a suitable boat for handling and processing wafers, particularly wafers composed of binary material, without an unacceptable breakage percentage.

SUMMARY OF THE INVENTION

Briefly, and in general terms, the invention is concerned with a boat for holding wafers during processing, including a bottom plate having a major surface comprising a plurality of substantially parallel V-groove notches extending from a first edge of the plate to a second edge of the plate; a first guiding rail connected to said bottom plate and disposed adjacent to said first edge of said bottom plate, the rail including a plurality of U-shaped notches having a substantially flat bottom, each of the U-shaped notches corresponding to a respective one of the V-groove notches, the U-shaped notches being disposed on the first guiding rail with respect to the position of the bottom plate so that an extension of one of the two longer sides associated with each of the U-shaped notches falls substantially adjacent to the line representing the extension of the apex line formed in the corresponding V-groove notch in the bottom plate; and a second guiding rail connected to the bottom plate and disposed adjacent to the second edge of said bottom plate, the rail including a plurality of U-shaped notches having a substantially flat bottom, each of the U-shaped notches corresponding to a respective one of the V-groove notches, the U-shaped notches being disposed on the second guiding rail with respect to the position of the bottom plate so that an extension of one of the two longer sides associated with each of the U-shaped notches falls substantially adjacent to the line representing the extension of the apex line formed in the corresponding V-groove notch in the bottom plate.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENTS

Figure 1:
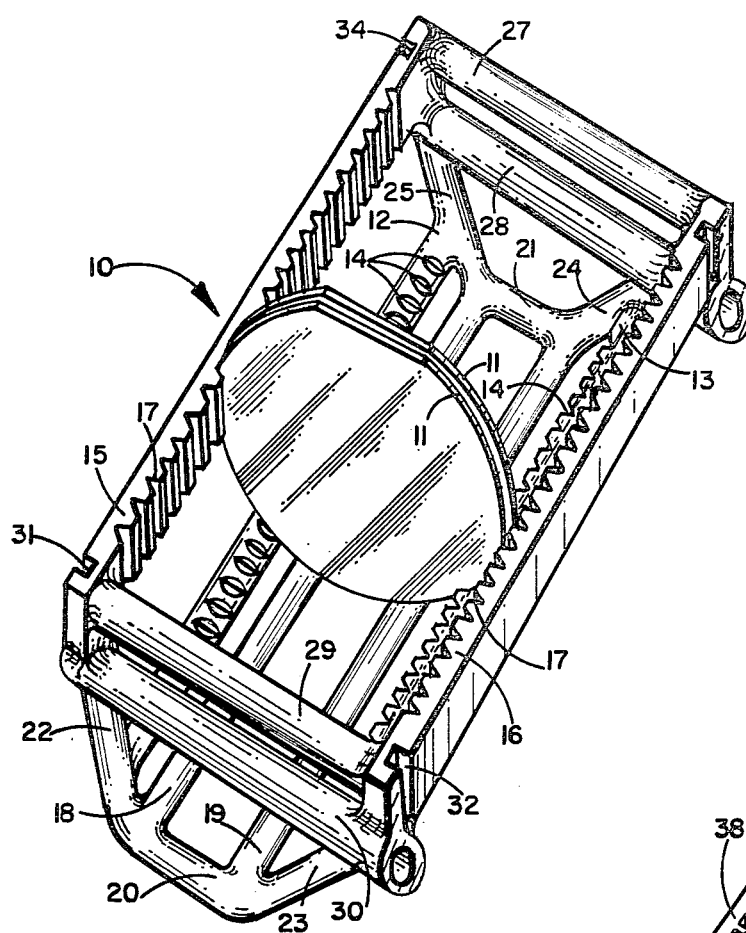
FIG. 1 is a perspective view of the boat for processing semiconductor wafers according to the prior art.

Turning now to FIG. 1 there is shown a perspective view of a boat 10 known in the prior art for holding wafers 11 typically composed of a semiconductor material. The boat 10 is designed for holding a plurality of wafers 11 without touching during processing or circuit fabrication operations. At the present time, semiconductor wafers are typically 2–4 inches in diameter, and about 12 to 24 mils in thickness. Each boat typically holds up to 25 wafers so that such wafers may be simultaneously subjected to processing. Examples of some of the processing operations to which the wafers may be subjected include oxidation, diffusion, LPCVD deposition, plasma etching, chemical etching, photoresist coating/baking/stripping, ultrasonic cleaning, as well as various automatic wafer handling operations. The application of wafer processing sequences is used in various semiconductor technologies including the fabrication of NMOS, PMOS, CMOS, SOS, bipolar, GaAs, and magnetic bubble memory devices.

The boat shown in FIG. 1 consists of a first 12 and a second 13 bottom rod for holding the wafers in position in the boat. The bottom rods 12 and 13 are each provided with a corresponding plurality of parallel V-grooves 14 which are used to hold the wafer in a specific position. The V-grooves 14 are disposed along an arcuate portion of the bottom rods so as to contact a circumferential portion of the wafers in the boat. A first 15 and second 16 guide rail is disposed above the bottom rods 12 and 13 respectively. Corresponding V-grooves 17 are also provided in the rails 14 and 15 in a position essentially above the V-grooves 14 in the rods 12 and 13. Once a wafer is placed in two V-grooves 14, in the bottom rods 12 and 13 respectively and the two corresponding V-grooves 17, in the rails 15 and 16 respectively the wafer has very little opportunity to wobble about any one of the contact points.

In addition to the structure noted above there are provided various structural members of the boat 10 which function to provide rigidity to the structure and connect the bottom rods 12, 13 to the rails 15, 16. These members include a bottom support which is shown as consisting of two parallel rods 18 and 19 disposed parallel to the bottom rods 12 and 13. In addition, connecting bars 20 and 21 are provided which connect the ends of the rods 18 and 19. Four vertical supports 22, 23, 24, and 25 are provided which connect the ends of the rod 14 and rail 15, and rod 13 and rail 16, with the bottom support 18, 19.

Finally, on the front and rear ends of the boat there are crossbars 27, 28, 29 and 30. Such crossbars provide structural rigidity to the boat.

It should also be noted that the exterior side of the guide rail 15 contains notches 31 and 34 disposed adjacent to the opposite ends of the rail, while the rail 16 contains similarly disposed notches 32 and 33. The function of such notches is to provide a location where the boat can be aligned by an external device for simultaneously transferring the wafers in the boat to another processing carrier.

In addition to the prior art boat shown in FIG. 1, there are a variety of other boat designs which still have a breakage problem. In one of such prior art boats (not shown) there are two slotted bottom rods, but no side rails. Such alternative boat designs still afford the wafer very little opportunity to wobble, and the slightest warping will still jam the wafer in the boat.

Figure 2:
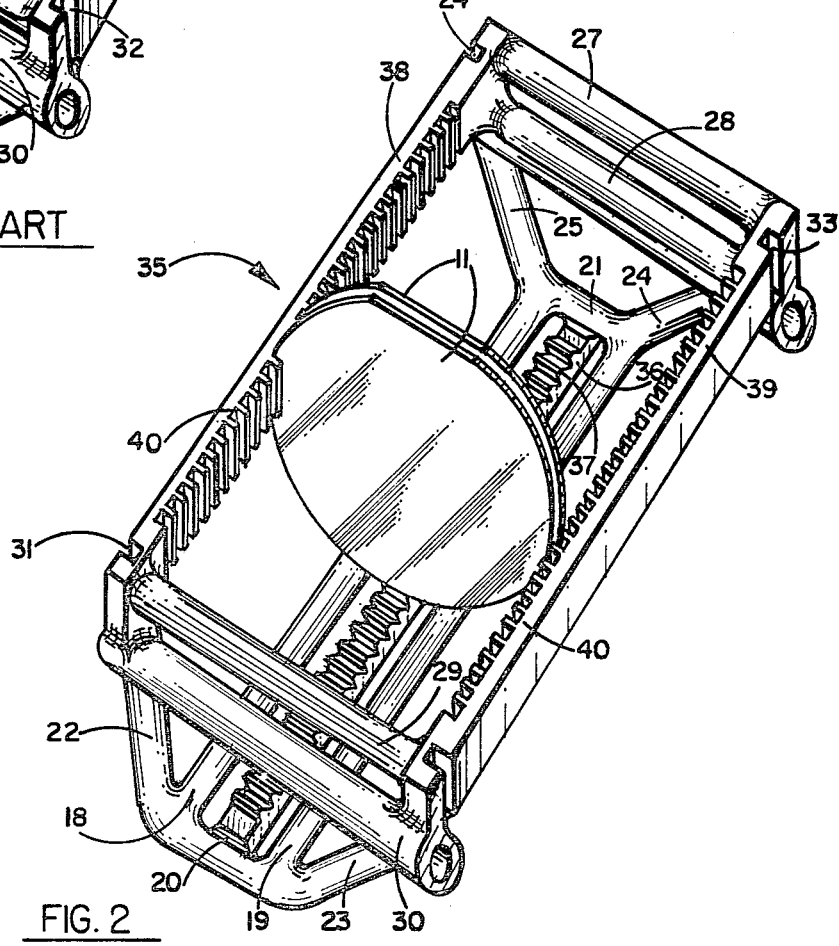
FIG. 2 is a boat for processing wafers as taught by the present invention.

Turning now to FIG. 2 there is shown a perspective view of a boat 35 according to the present invention for holding wafers 11. Many of the basic structural features found in the boat 10 are also present in the boat 35: like reference numerals have been used for such parts, including rods 18 and 19, connecting bars 20 and 21, vertical supports 22, 23, 24, and 25, and crossbars 27, 28, 29, and 30.

The boat 35 includes a bottom plate 36 extending between connecting bars 20 and 21. The plate 36 is formed as a rectangularly shaped slab having a plurality of equally spaced, substantially parallel V-groove notches 37 extending across the width of the upper major surface of the plate. Such V-groove notches extend parallel to the shorter edge of the plate, i.e. the edge abutting the connecting bars 20 and 21.

The boat 35 further includes side rails 38 and 39 which are connected to the tops of the vertical supports, and the ends of the crossbars. The side rail 38 is disposed above, parallel to, and away from the rod 18, while the side rail 39 is disposed above, parallel to, and away from the rod 19. The side rails 38, 39 are rectangular plates having a plurality of U-shaped notches 40 on the interior side of the rail (i.e., the side facing the interior of the boat). The U-shaped notches 40 function to hold the opposite sides of the wafers 11 placed in the boat. The U-shaped notches 40 are parallel to one another and equally spaced, and extended from one end of the rail to the other. The bottom of the U-shaped notches 40 is substantially flat.

Each of the U-shaped notches 40 correspond to a single one of the V-groove notches 37, so that a wafer 11 placed in one of the V-groove notches 37 will have its sides rest in the corresponding U-shaped notches 40. The U-shaped notches 40 are disposed in relation to the V-groove notches 37 so that an extension of one side of each of the U-shaped notches 40 falls closely adjacent to the line representing the extension of the apex line of the corresponding V-groove notch 37, as can be seen from FIG. 6.

The advantages of the boat according to the present invention include:

(1) extremely low wafer breakage rate (i.e. close to zero) regardless of the speed which the boat is withdrawn from the furnace. Wafers in the boat according to the present invention have a greater degree of freedom to warp without breaking than those of the prior art;

(2) high tolerance in wafer thickness: wafers with 1 to 100 mils thickness can be handled using the boat according to the present invention;

(3) high tolerance in wafer diameter: a wafer diameter tolerance of ±500 mils (incoming wafer spec. is at 10 mils) can be handled without breakage in the boat according to the present invention;

(4) the boat puller and temperature ramp controller, which are used in the prior art to reduce wafer breakage, are not needed with the boat according to the present invention; and (5) dump transfer capability is possible with the boat according to the present invention.

Figure 3:
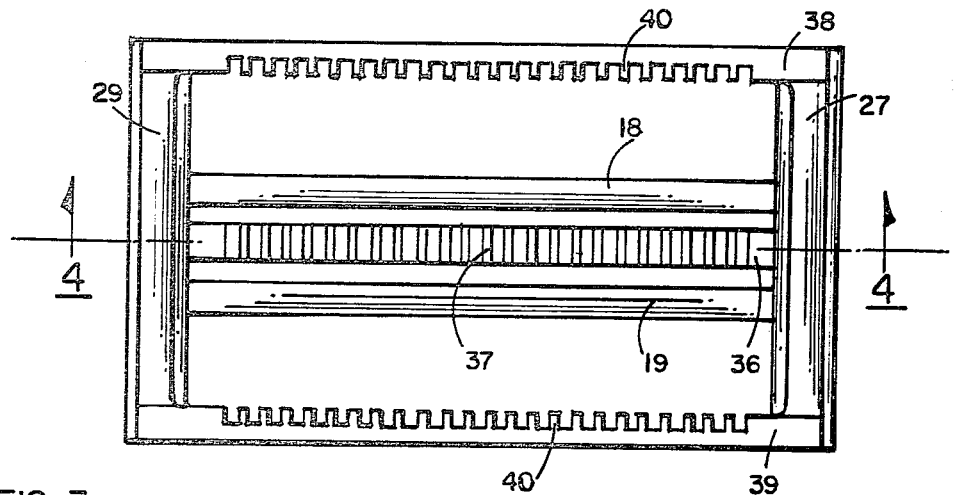
FIG. 3 is a top view of the boat as shown in FIG. 2 according to the present invention.

FIG. 3 is a top view of the boat as is shown in FIG. 2 according to the present invention. The upper crossbars 27 and 29 are shown, as well as the bottom rods 18 and 19. The bottom plate 36 is shown with the plurality of V-groove notches 37 extending along the width of the plate. The first and second rails 38 and 39 are also shown, including the U-shaped notches 40.

Figure 4:
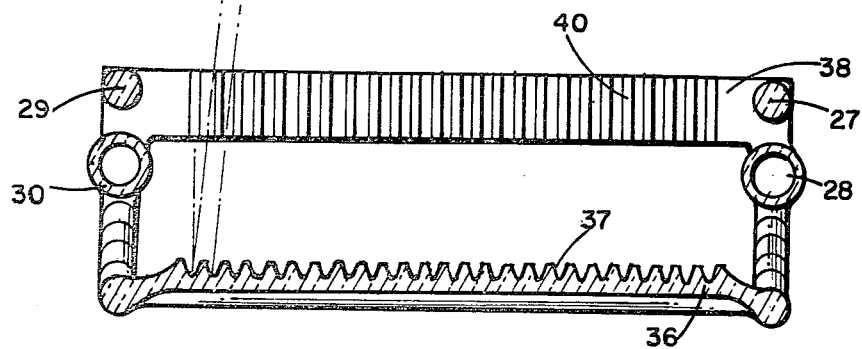
FIG. 4 is a cut-away side view of the boat as shown in FIG. 2 according to the present invention.

FIG. 4 is a cut-away side view of the boat in FIGS. 2 and 3 through the 4—4 plane shown in FIG. 3. The cross-section of the upper crossbars 27 and 29 are now shown, as well as the cross-section of the bottom plate 36 with the V-groove notches 37. The first raiil 38, with the U-shaped notches 40 therein, is also shown.

Figure 5:
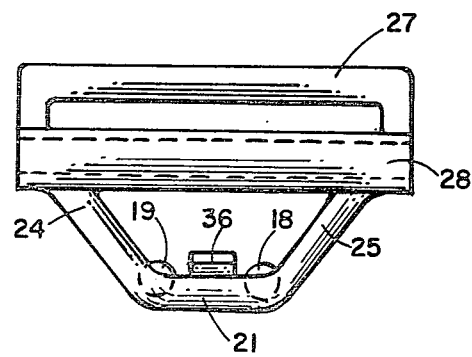
FIG. 5 is an end view of the boat as shown in FIG. 2 according to the present invention.

FIG. 5 is an end view of the boat as shown in FIG. 2 according to the present invention. The two upper crossbars 27 and 28 are shown, together with two of the vertical supports 24 and 25, and the connecting bar 21. Portions of the bottom rods 18 and 19 are also shown. The end cross-section of the bottom plate 36 is also shown.

Figure 6:
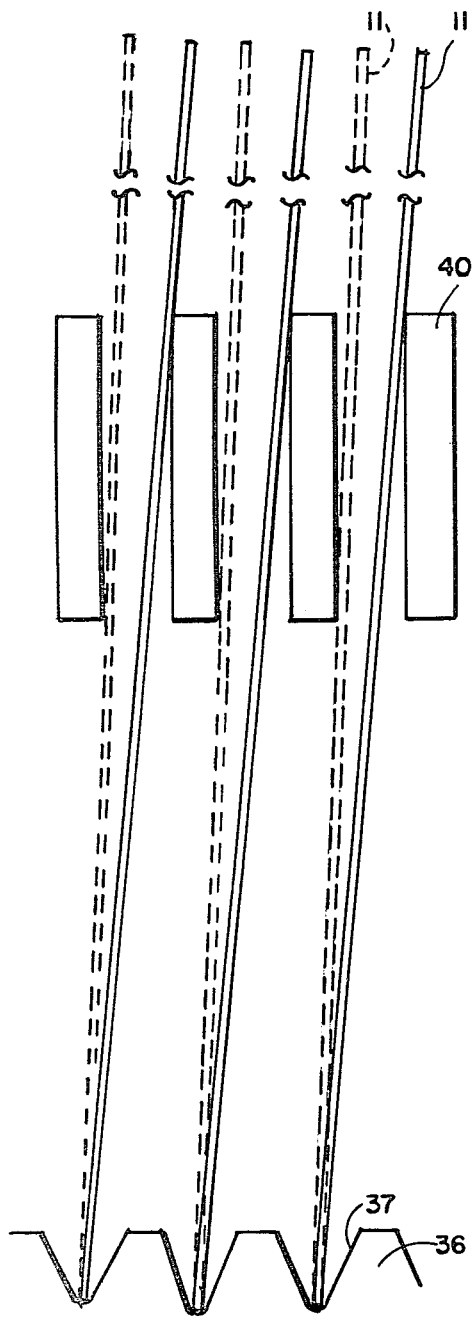
FIG. 6 is an enlarged cut-away side view of a portion of the boat with wafers resting therein according to the present invention.

FIG. 6 is an enlarged cut-away side view of a portion of the boat with wafer 11 resting therein in a first position (shown by a dotted line), and in a second position (shown by a dotted line). The bottom plate 36 with the notches 37 into which the wafers rest is also shown. Above the bottom plate 36 is one of the rails with the U-shaped notches 40, against which the wafers 11 rest. it should be noted that although the notches 37 are V-shaped, they have rounded bottoms.

One of the other advantages of the boat according to the present invention is illustrated in FIG. 6, which shows the wafers 11 aligning in a near perfect parallel configuration. Such a configuration, with substantially equal spacing between wafers, allows uniform flow of gases between the wafers, thereby permitting much more uniform oxidation, diffusion, or other surface reactions over the entire diameter of the wafer than in configurations according to the prior art.

Figure 7A:
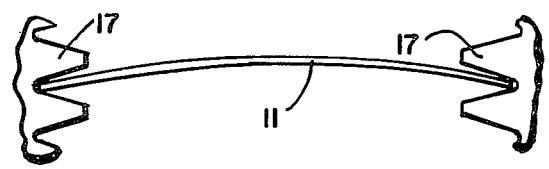
FIG. 7a is an enlarged top view of a boat according to the prior art with a semiconductor wafer placed therein which has warped.

FIG. 7a is an enlarged top view of a boat according to the prior art with a semiconductor wafer placed therein which has warped.

Figure 7B:
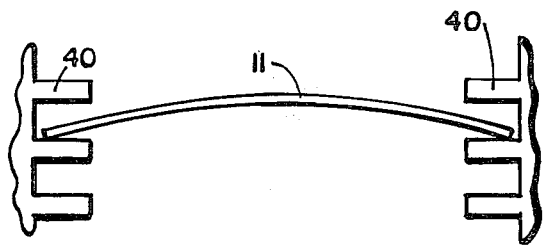
FIG. 7b is a top view of the boat according to the present invention as shown in FIG. 2 with a semiconductor wafer placed therein which has warped.

FIG. 7b is a top view of the boat according to the present invention as shown in FIG. 2 with a semiconductor wafer placed therein which has warped.

It is noted in FIG. 7a that the wafer 11 is pressed against the sides of the V-grooves 17, thereby tightly constraining the wafer 11. Moreover, the wafer is further constrained by the grooves 14 in the two bottom rods 12 and 13 (not shown). In practice, as the wafer is warped due to different differential rates of cooling, the combination of pressure against both the V-grooves 14 and 17 in the boat of the prior art increases until the stress across the surface of the wafer is too great for the wafer 11 to bear, whereupon it shatters.

In FIG. 7b, on the other hand, it is noted that the wafer 11 has much more room between the teeth 40, and even in its warped state the wafer 11 is not pressed against the sides of the teeth 40. Moreover, the single slot 27 in the bottom plate 36 (not shown) permits a far greater degree of freedom and movement of the wafer as it warps, so that a far smaller amount of stress is built up across the surface of the wafer. Therefore, there is a much smaller tendency for the wafers to shatter in the boat according to the present invention.

The V-groove notches in the bottom plate and the U-shaped notches are disposed with respect to one another so that a wafer placed in one of the V-groove notches and lying in a corresponding U-shaped notch is capable of pivoting at an angle of approximately five degrees around a fixed point in the apex of the said V-groove notch.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

I claim:

1. A boat for holding wafers during processing, comprising:
    a bottom plate having a major surface comprising a plurality of substantially parallel V-groove notches extending from a first edge of said plate to a second edge of said plate;
    a first guiding rail connected to said bottom plate and disposed above and adjacent said first edge of said bottom plate, said rail including a plurality of U-shaped notches having a substantially flat bottom, each of said U-shaped notches corresponding to a respective one of said V-groove notches, said U-shaped notches being disposed with respect to said bottom plate so that the normal from a point on one side of each of said U-shaped notches where a wafer placed in said U-shaped notch contacts said one side falls substantially on the line representing the extension of the apex line in the corresponding V-groove notch in said bottom plate;
    a second guiding rail connected to said bottom plate and disposed above and adjacent to said second edge of said bottom plate, said rail including a plurality of U-shaped notches having a substantially flat bottom, each of said U-shaped notches corresponding to a respective one of said V-groove notches, said U-shaped notches being disposed with respect to said bottom plate so that the normal from a point on one side of each of said U-shaped notches were a wafer placed in said U-shaped notch contacts said one side falls substantially on the line representing the extension of the apex line in the corresponding V-groove notch in said bottom plate and said one sides of the U-shaped notches, corresponding to a common said apex line, being aligned; and
    the normal from a point on the respective other side of each of said U-shaped notches, where a wafer placed therein contacts said other side, falls beyond the nearest corner of the corresponding V-groove notch.

2. A boat as defined in claim 1, wherein said V-groove notches in said bottom plate have rounded bottoms.

3. A boat as defined in claim 1, wherein said U-shaped notches are equally spaced apart from one another.

4. A boat as defined in claim 1, wherein said bottom plate is a rectangularly shaped slab.

5. A boat as defined in claim 4, wherein said V-groove notches extend parallel to the shorter edge of said rectangularly shaped slab.

6. A boat as defined in claim 5, wherein said V-groove notches are equally spaced from one another.

7. A boat as defined in claim 1, wherein said V-groove notches in said bottom plate and said U-shaped notches are disposed with respect to one another so that a wafer placed in one of said V-groove notches and lying in a corresponding U-shaped notch is capable of pivoting at an angle of approximately five degrees around a fixed point in the apex of said one V-groove notch.

* * * * *